(12) United States Patent
Velazquez

(10) Patent No.: US 12,420,315 B2
(45) Date of Patent: Sep. 23, 2025

(54) GAS DELIVERY PALLET ASSEMBLY, CLEANING UNIT AND CHEMICAL MECHANICAL POLISHING SYSTEM HAVING THE SAME

(71) Applicant: Applied Materials, Inc., Santa Clara, CA (US)

(72) Inventor: Edwin Velazquez, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 276 days.

(21) Appl. No.: 17/970,434

(22) Filed: Oct. 20, 2022

(65) Prior Publication Data

US 2024/0131562 A1 Apr. 25, 2024
US 2024/0226970 A9 Jul. 11, 2024

(51) Int. Cl.
*B08B 5/02* (2006.01)
*B24B 37/30* (2012.01)
*B24B 53/017* (2012.01)

(52) U.S. Cl.
CPC ............... *B08B 5/02* (2013.01); *B24B 37/30* (2013.01); *B24B 53/017* (2013.01)

(58) Field of Classification Search
None
See application file for complete search history.

(56) References Cited

U.S. PATENT DOCUMENTS

| | | |
|---|---|---|
| 6,099,396 A | 8/2000 | Krone-Schmidt |
| 8,079,894 B2 | 12/2011 | Tolles et al. |
| 2006/0189138 A1 | 8/2006 | Nishimura et al. |
| 2018/0337020 A1 | 11/2018 | Bishop |
| 2019/0157118 A1 | 5/2019 | Hombo et al. |
| 2022/0310404 A1 | 9/2022 | Cui et al. |

FOREIGN PATENT DOCUMENTS

| | | | |
|---|---|---|---|
| JP | 2008172031 A | * | 7/2008 |
| KR | 20170118996 A | * | 10/2017 |

OTHER PUBLICATIONS

International Search Report and Written Opion for Applicaion No. PCT/US2023/032374 dated Jan. 2, 2024, 9 pages.

* cited by examiner

Primary Examiner — Eric W Golightly
(74) Attorney, Agent, or Firm — Patterson + Sheridan, LLP

(57) ABSTRACT

A modular gas pallet assembly is disclosed herein, along with a cleaning unit and chemical mechanical polisher having the same. In one example, the gas pallet assembly includes three outlets and two or less inlets. The gas pallet assembly has first and second primary gas conduits secured to a first mounting plate. The second primary gas conduits is split into two branches, each having their own flow control. The modular gas pallet assembly is configured to provide gas towards a base plate of a substrate cleaner, to substrate gripping pins of the substrate cleaner, and to a bottom of a substrate held by the substrate gripping pins of the substrate cleaner.

19 Claims, 6 Drawing Sheets

GAS DELIVERY PALLET ASSEMBLY, CLEANING UNIT AND CHEMICAL MECHANICAL POLISHING SYSTEM HAVING THE SAME

BACKGROUND

Field

Embodiments described herein generally relate to equipment used in the manufacturing of electronic devices, and more particularly, to a substrate processing system which may be used to clean the surface of a substrate, particularly after or as part of a chemical mechanical polishing (CMP) system.

Description of the Related Art

Chemical mechanical polishing (CMP) is commonly used in the manufacturing of high-density integrated circuits to planarize or polish a layer of material deposited on a substrate. In a typical CMP process, a substrate is retained in a carrier head that presses the front side of the substrate against a rotating polishing pad in the presence of a polishing fluid. Material is removed across the material layer surface of the substrate in contact with the polishing pad through a combination of chemical and mechanical activity, which is provided by the polishing fluid and a relative motion of the substrate and the polishing pad. Typically, after one or more CMP processes are completed, a polished substrate is cleaned, for example, in a cleaning unit coupled to the CMP system. The cleaning unit may include multiple cleaning stations, i.e., cleaning modules, used to perform various cleaning operations. Once the post-CMP operations are complete, the substrate can be removed from the CMP system and then delivered to the next device manufacturing system, such as a lithography, etch, or deposition system.

In cleaning units having multiple cleaning modules, limited space is available for transferring substrates between the various modules. The space limitation problem is exacerbated due to high cost of ownership for FAB operators, when cleaning equipment takes up valuable space that can be more cost effectively utilized for other processing equipment. Additionally, large cleaning enclosures undesirably increase the time a substrate is exposed to air, which risks oxidation and particulate contamination of the substrate. For this reason, modules within a cleaning unit are arranged as closely together as possible, leaving little room for robot-like devices to grasp a substrate, change its orientation and insert it into another module. This compaction of space also leaves little space available for gas control systems and associated routing within the cleaning unit, resulting in a gas delivery system that is difficult to maintain and service, and lacks the ability to expand or be replaced should cleaning processes be changed in the future.

Accordingly, there is a need for an improved gas delivery system and cleaning unit having the same.

SUMMARY

Modular gas pallet assemblies are disclosed herein, along with a cleaning unit and chemical mechanical polisher having the same. In one example, the gas pallet assembly includes a first and second primary gas conduits secured to a first mounting plate. The first primary gas conduit includes a first inlet port, a first normally closed valve, a first regulator coupled between the first normally closed valve and the first inlet port, a first outlet port, a first filter coupled to the first outlet port, and a first flow controller coupled between the first filter and the first normally closed valve. The second primary gas conduit includes a second inlet port, a second normally closed valve, a second regulator coupled between the second normally closed valve and the second inlet port, a second outlet port, a second filter coupled to the second outlet port, a second flow controller coupled between the second filter and the second normally closed valve, a third normally closed valve coupled to a tee disposed between the second regulator and the second normally closed valve, a third outlet port, a third filter coupled to the third outlet port, and a third flow controller coupled between the second filter and the second normally closed valve.

In another example, a second pallet assembly configured identical to the pallet assembly described in the preceding paragraph above are vertically stacked together.

In another example, a cleaning unit is provided. The cleaning unit includes a gas pallet assembly and a first cleaning module (FCM). The gas pallet assembly has three outlets and two or less inlets. The outlets of the gas pallet assembly are connected to the FCM. The FCM includes a base plate having gripper pins configured to secure a substrate during processing, a first arm movable between positions above and clear of the base plate, a first FCM outlet port disposed on the first arm that is connected to the first outlet port, a second FCM outlet port disposed on the first arm that is to the second outlet port, and a third FCM outlet port disposed in the base plate that is connected to the third outlet port.

In still another example, a substrate processing system is provided that includes a chemical mechanical polisher, a substrate transfer device, and a substrate cleaning unit. The substrate cleaning unit is coupled to the chemical mechanical polisher. The substrate transfer device is configured to move a substrate from the chemical mechanical polisher to the substrate cleaning unit. The substrate cleaning unit further includes a first plurality of stacked integrated cleaner dryers, a first plurality of stacked gas pallets disposed directly below the first plurality of stacked integrated cleaner dryers, a second plurality of stacked integrated cleaner dryers disposed laterally offset from the first plurality of stacked integrated cleaner dryers, and a second plurality of stacked gas pallets disposed directly below the second plurality of stacked integrated cleaner dryers. A respective one of the first plurality of stacked gas pallets is coupled to a respective one of the first plurality of stacked integrated cleaner dryers. A respective one of the second plurality of stacked gas pallets is coupled to a respective one of the second plurality of stacked integrated cleaner dryers.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to equipment used in the manufacturing of electronic devices, and more particularly, to a cleaning unit which may be used to clean the surface of a substrate following chemical mechanical polishing of the substrate in a semiconductor device manufacturing process. The cleaning unit includes modular gas pallet assemblies which are stacked in the bottom region of the cleaning unit. The gas pallet assemblies may readily be exchanged and/or added to the cleaning unit, thus, enabling efficient and cost effective service and expansion of the cleaning unit. The location of the stacked gas pallet assemblies also enables ease of service, including enabling one cleaning module to be serviced while the other cleaning modules of the cleaning unit remain operational, thus having minimal impact on factory throughput during servicing.

Figure 1A:
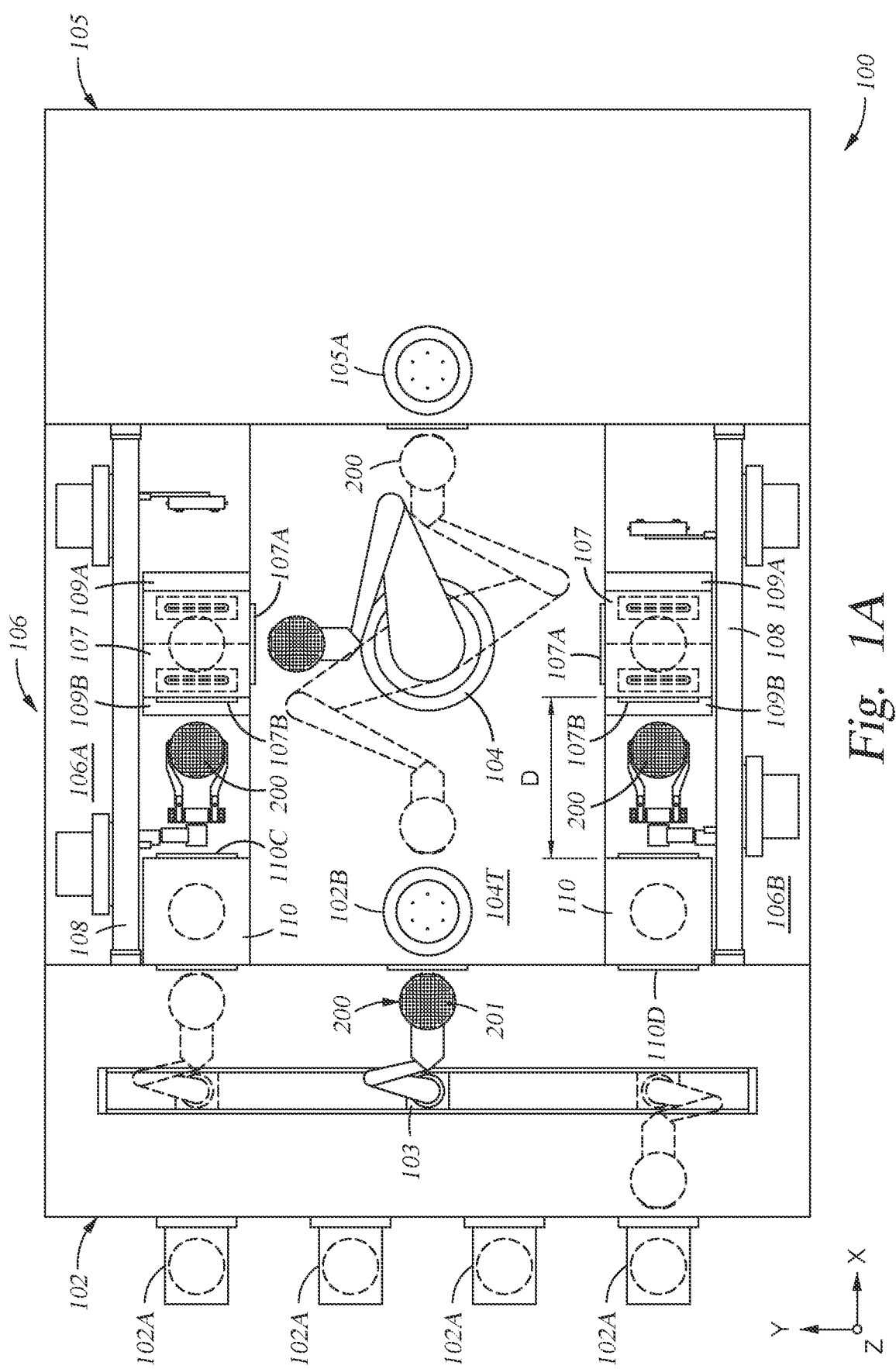
FIG. 1A is a schematic top view of an exemplary chemical mechanical polishing (CMP) system having an integrated cleaning unit.
Figure 1B:
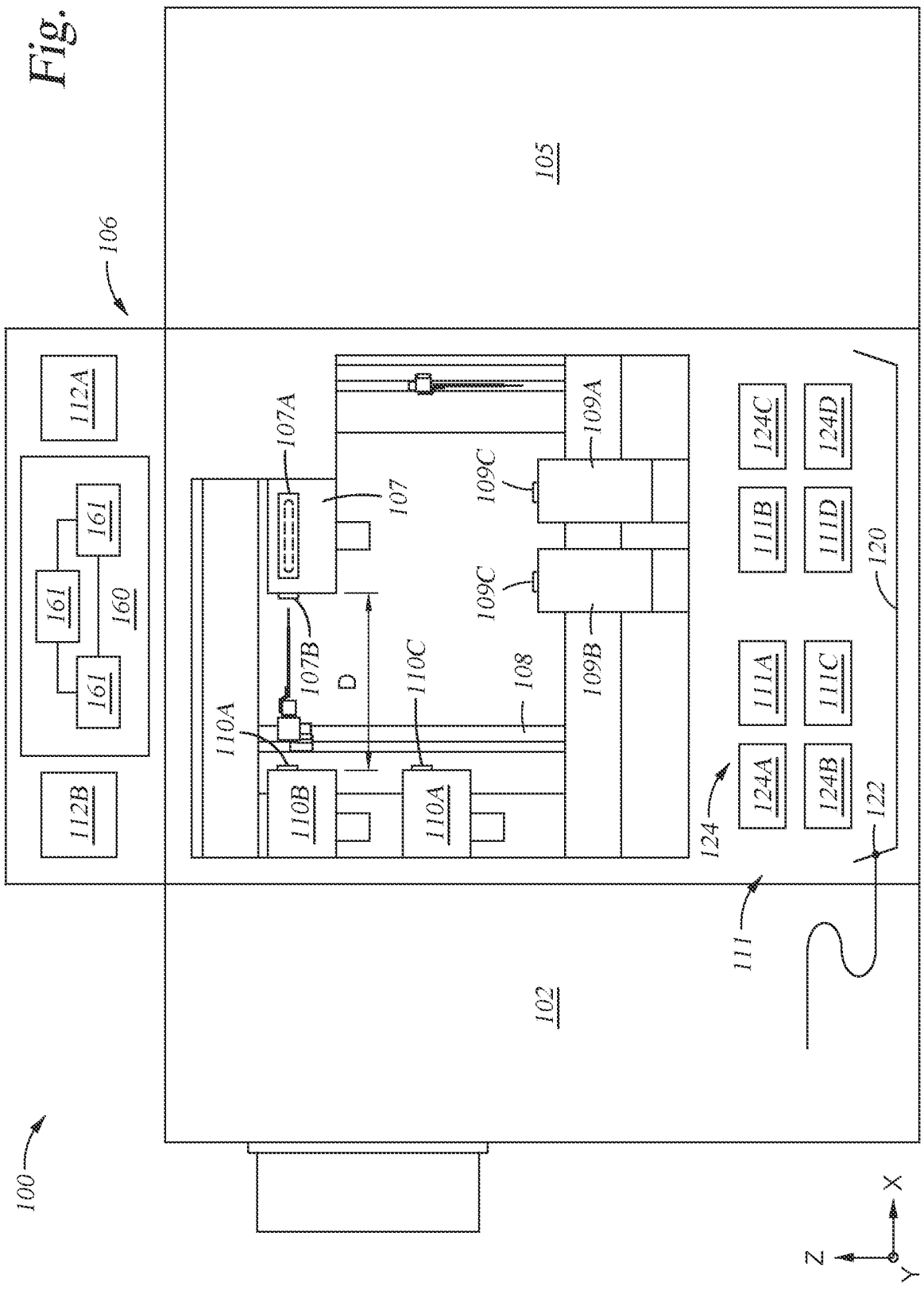
FIG. 1B is a schematic side view of the CMP system of FIG. 1A illustrating a plurality of gas pallet assemblies disposed at the bottom of the integrated cleaning unit.

FIGS. 1A and 1B are schematic top and side views of an exemplary chemical mechanical polishing (CMP) system 100 having a cleaning unit 106 that utilizes modular gas pallet assemblies 124. The modular gas pallet assemblies 124 may be easily removed, replaced and/or added to the cleaning unit 106, as further described below.

The CMP system 100 includes one or more polishing stations 105, a factory interface 102 having a first substrate handler 103, and the cleaning unit 106 that includes a second substrate handler 104. The factory interface 102 may include one or more loading stations 102A. The loading stations 102A may be, for example, FOUPs or cassettes. Each loading station 102A may include one or more substrates 200 for CMP in the CMP system 100.

The first substrate handler 103 is positioned to transfer a substrate 200 to and from one or more of the loading stations 102A. The first substrate handler 103 transfers a substrate 200 from a loading station 102A to the cleaning unit 106, e.g., to a cleaner pass-through 102B, where the substrate 200 can be picked up by the second substrate handler 104. As another example, the first substrate handler 103 transfers a substrate 200 from the cleaning unit 106, e.g., from the cleaner pass-through 102B, to the loading station 102A.

The substrate 200 is initially positioned in the loading station 102A prior to processing in the polishing stations 105. The first substrate handler 103 transfers the substrates 200 to the cleaner pass-through 102B. The first substrate handler 103 also transfer polished substrates 200 from the cleaning unit 106 back to the loading station 102A.

The second substrate handler 104 is positioned to transfer substrates 200 from the cleaner pass-through 102B to a transfer station 105A of the polishing station 105 for polishing. The second substrate handler 104 is also operable to transfer substrates 200 from the transfer station 105A of the polishing station 105 to the cleaning unit 106 after polishing in the polishing station 105. In one example, the second substrate handler 104 retrieves polished substrates 200 from the transfer station 105A within the polishing station 105 and transfers the substrate 200 to one of the cleaning modules in the cleaning unit 106.

The polishing station 105 is a chemical mechanical polisher that may include a plurality of polishing stations (not shown). The polishing station 105 includes one or more polishing assemblies that are used to polish the substrate 200. Typically, each of the one or more polishing assemblies will include the use of a polishing platen (not shown) and polishing head (not shown), which is configured to urge the substrate 200 against a polishing pad (not shown) disposed on the polishing platen. The substrate 200 is polished in the presence of a polishing fluid. The polishing fluid may include abrasives. Residual abrasive particles and/or liquids such as acidic or basic chemicals contained in the polishing fluid may remain on the substrate 200 after undergoing chemical mechanical polishing in the polishing station 105.

As shown in FIG. 1A, the cleaning unit 106 may be comprised of two cleaning units 106A, 106B disposed in parallel to one another on opposite sides of the second substrate handler 104. The cleaning units 106A, 106B include a plurality of cleaning modules, such as one or more first cleaning modules, one or more second cleaning modules and one or more third cleaning modules, as discussed below. Each gas pallet assembly 124 is configured to provide gas to a respective single one of the cleaning modules of the cleaning units 106A, 106B. This allows any cleaning module and/or gas pallet assembly 124 to be serviced without taking the other modules out of service, thereby enabling substrates to be cleaned in the cleaning units 106A, 106B even during servicing. The gas pallet assemblies 124 may be stacked under each of the cleaning units 106A, 106B to converse space within the system 100 and provide room for substrate transfer.

The cleaning unit 106A is essentially a mirror-duplicate of the cleaning unit 106B. The cleaning unit 106A includes a plurality of cleaning stations (i.e., modules shown in FIG. 1A as a first cleaning module 107, a second cleaning module 109, and a third cleaning module 110) and third substrate handler 108. In some embodiments, the first cleaning module, while not intending to be limiting as to the scope of the disclosure provided herein is often referred to herein as the pre-cleaning module 107. In some embodiments, the second cleaning module 109, while not intending to be limiting as to the scope of the disclosure provided herein is often referred to herein as the vertical cleaning module 109. In some embodiments, the third cleaning module 110, while not intending to be limiting as to the scope of the disclosure provided herein, is often referred to herein as the drying (ICD) module 110. In some embodiments, the vertical cleaning module 109 may be provided as a first vertical cleaning module 109A and a second vertical cleaning module 109B. In some embodiments, the ICD module 110 may be provided as a first ICD module 110A and a second ICD module 110B. In some embodiments, as illustrate in FIG. 1A, the third substrate handler 108 within each of the cleaning unit 106A, 106B is positioned such that it is at an external edge of the cleaning unit 106A, 106B of the CMP system 100. In this configuration, the substrate handler 108 is positioned on an external side of the first, second, and third cleaning modules that is opposite to an internal side of the first, second, and third cleaning modules that faces the robot tunnel 104T and the second substrate handler 104 of the CMP system 100.

The pre-cleaning module 107 is configured to process a substrate 200 disposed in a substantially horizontal orientation, i.e., in the X-Y plane, with the processing surface 201 facing up. In some embodiments, each cleaning unit 106A, 106B includes two vertical cleaning modules 109A, 109B configured to process a substrate 200 disposed in a substantially vertical orientation, i.e., in the Z-Y plane, with the processing surface 201 facing the factory interface 102.

As noted above, the pre-cleaning module 107 receives a polished substrate 200 from the second substrate handler 104 through a first door 107A formed in a first side panel of the pre-cleaning module 107. The first door 107A may be, for example, a slit valve that is configured to isolate an interior region of the pre-cleaning module 107 from the exterior region of the pre-cleaning module 107. The substrate 200 is received in a horizontal orientation by the pre-cleaning module 107 for positioning on a horizontally disposed substrate support surface therein. The pre-cleaning module 107 then performs a pre-clean process, such as a buffing process, on the substrate 200 before the substrate 200 is transferred therefrom using the third substrate handler 108, which is also sometimes referred to herein as the third substrate handler 108. In some embodiments, the buffing process will include sweeping a buffing pad across a surface of the substrate that is positioned on the horizontally disposed substrate support surface to remove left over slurry (e.g., polishing fluid), scratches and other imperfections found on the surface of the substrate. The buffing pad may include a material such as a polyurethane, acrylate or other polymeric material.

The third substrate handler 108 transfers substrate 200 from the pre-cleaning module 107 via a second door 107B that cover the opening formed in a second side panel of the pre-cleaning module 107. The second door 107B may be, for example, a slit valve. The second side panel may be, for example, orthogonal to the first side panel. The substrate 200 is still in a horizontal orientation, i.e., oriented in the X-Y plane, as it is removed from the pre-cleaning module 107. After the substrate 200 is transferred from the pre-cleaning module 107, the third substrate handler 108 rotates the substrate 200 to a vertical orientation, i.e., orientated in the Y-Z plane and the processing surface 201 facing the factory interface 102 for further processing in the vertical cleaning modules 109A, 109B of the cleaning unit 106. For example, after the substrate 200 is transferred from the pre-cleaning module 107, the third substrate handler 108 may rotate the substrate 200 about the Y-axis by 90 degrees to change the orientation to the vertical position, and also rotate the substrate about the Z-axis by 180 degrees so that the processing surface 201 faces the factory interface 102. The Y-axis rotation and Z-axis rotation may be completed serially or with overlapping time intervals.

After rotating the substrate 200 so that the processing surface 201 faces the factory interface 102, the third substrate handler 108 transfers the substrate 200 to the vertical cleaning module 109A through a door 109C (shown in FIG. 1B). The transferring process may include the movement of the third substrate handler 108 in at least one direction, such as the X-direction. The door 109C may be, for example, a slit valve. Each cleaning unit 106A, 106B may include two vertical cleaning modules 109A, 109B. The two vertical cleaning modules 109A, 109B may be arranged linearly, i.e., in the X direction, in each respective cleaning unit 106A, 106B. The two vertical cleaning modules 109A, 109B may also be arranged substantially below the pre-cleaning module 107, i.e., in the Z direction, in each respective cleaning unit 106A, 106B. Such an arrangement of the vertical cleaning modules 109A, 109B below the pre-cleaning module 107 may provide for a reduced footprint of the overall cleaning unit 106 and also help to reduce the transfer time between these modules to improve throughput and importantly reduce a wet substrate's ability to dry and reduce the substrate's air exposure time between cleaning steps.

In some embodiments, the vertical cleaning modules 109A, 109B may be any one or combination of contact and non-contact cleaning units for removing polishing byproducts from the surfaces of a substrate, e.g., spray boxes and/or scrubber brush boxes.

The vertical cleaning module 109 includes the cylindrical rollers that can be actuated against major surfaces of the substrate 200. A second processing fluid, such as DI water and/or one or more second cleaning fluids, is applied to the surface of the substrate 200 from a second fluid source while the substrate 200 and cylindrical rollers are rotated by the various actuators and motors. In some embodiments, the second processing fluid provided to the surface of the substrate is different from the first processing fluid provided to the surface of the substrate in the pre-cleaning module 107. During cleaning processing in each vertical cleaning module 109A, 109B, the substrate 200 may be positioned so that the processing surface 201 faces the factory interface 102. In another embodiment, the vertical cleaning modules 109A and 109B are oriented within the cleaning units 106A, 106B so that the processing surface 201 during a cleaning process faces an orientation that is substantially perpendicular to the factory interface 102 (e.g., parallel to the X-Z plane). In another embodiment, the vertical cleaning modules 109A and 109B are oriented within the cleaning units 106A, 106B so that the processing surface 201 of the substrate 200 during a cleaning process face an orientation that is at an angle between parallel to the X-Z plane and parallel to Y-Z plane.

According to an embodiment, the cleaning units 106A, 106B may each be configured to sequentially process each substrate 200 through two vertical cleaning modules 109A, 109B as a two-step cleaning process. That is, after the substrate 200 undergoes cleaning processing in the vertical cleaning module 109A closest to the polishing station 105, the third substrate handler 108 transfers the substrate 200 to the vertical cleaning module 109B closest to the factory interface 102 for further cleaning processing. During a cleaning process sequence, after processing for a first period time in the first vertical cleaning module 109A the substrate is then transferred to the second vertical cleaning module 109B and then processed for a second period of time, which is typically substantially similar to the first period of time. The processes performed in the first vertical cleaning module 109A and second vertical cleaning module 109B can include using similar fluid chemistries and mechanical processing parameters (e.g., cylindrical roller rotation speeds and application forces). In some embodiments, the first vertical cleaning module 109A is adapted to perform a rough cleaning step to remove the bulk of the remaining contaminants remaining on the substrate after performing the first cleaning process in the first cleaning module, and the second vertical cleaning module 109B is configured to perform a cleaning process that is adapted to remove any remaining contaminants leftover from the process performed in the first vertical cleaning module 109A.

The third substrate handler 108 then transfers the substrate 200 to an available one of the ICD modules 110A, 110B through a first door 110C (shown in FIG. 1A) formed in a first side panel of the available one of the ICD modules 110A, 110B. The door 110C may be, for example, a slit valve. As shown in FIGS. 1A-1B, each cleaning unit 106A, 106B may include two ICD modules 110A, 110B arranged vertically, i.e., in the Z direction. Each of the ICD modules 110A, 110B performs cleaning and drying processing on the substrate 200. For example, the ICD modules 110A, 110B may rinse and dry the substrate 200. For example, the ICD modules 110A, 110B may apply isopropyl alcohol (IPA) vapor while rinsing the substrate 200 with DI water to adjust the liquid surface tension and thereby decrease adhesion of liquid to the substrate 200 during rinsing and drying processing.

The horizontal arrangement of the ICD modules 110A, 110B may provide for an increased throughput of substrates 200 for cleaning and drying processing while maintaining a reduced footprint of the overall cleaning unit 106. Such an arrangement of the ICD modules 110A, 110B in the CMP system 100 will help to reduce the transfer time between the vertical cleaning modules 109B and the ICD modules 110A, 110B to improve throughput and importantly reduce a wet substrate's ability to dry and reduce the substrate's air exposure time between cleaning steps.

The cleaning unit 106 can be operated with two, three, four or more ICD modules 110. However, it is contemplated for most applications that the cleaning unit 106 will be operated with two or four ICD modules 110. That is, both cleaning units 106A, 106B may be operated with the same number (one or two) of ICD modules 110. In some embodiments, each of the cleaning units 106A, 106B include two ICD modules 110 that are stacked vertically. As the ICD modules 110 are generally self-contained, one type of ICD module 110 may be replaced with another, or additional ICD modules 110 may be later added to the cleaning unit 106.

Figure 2:
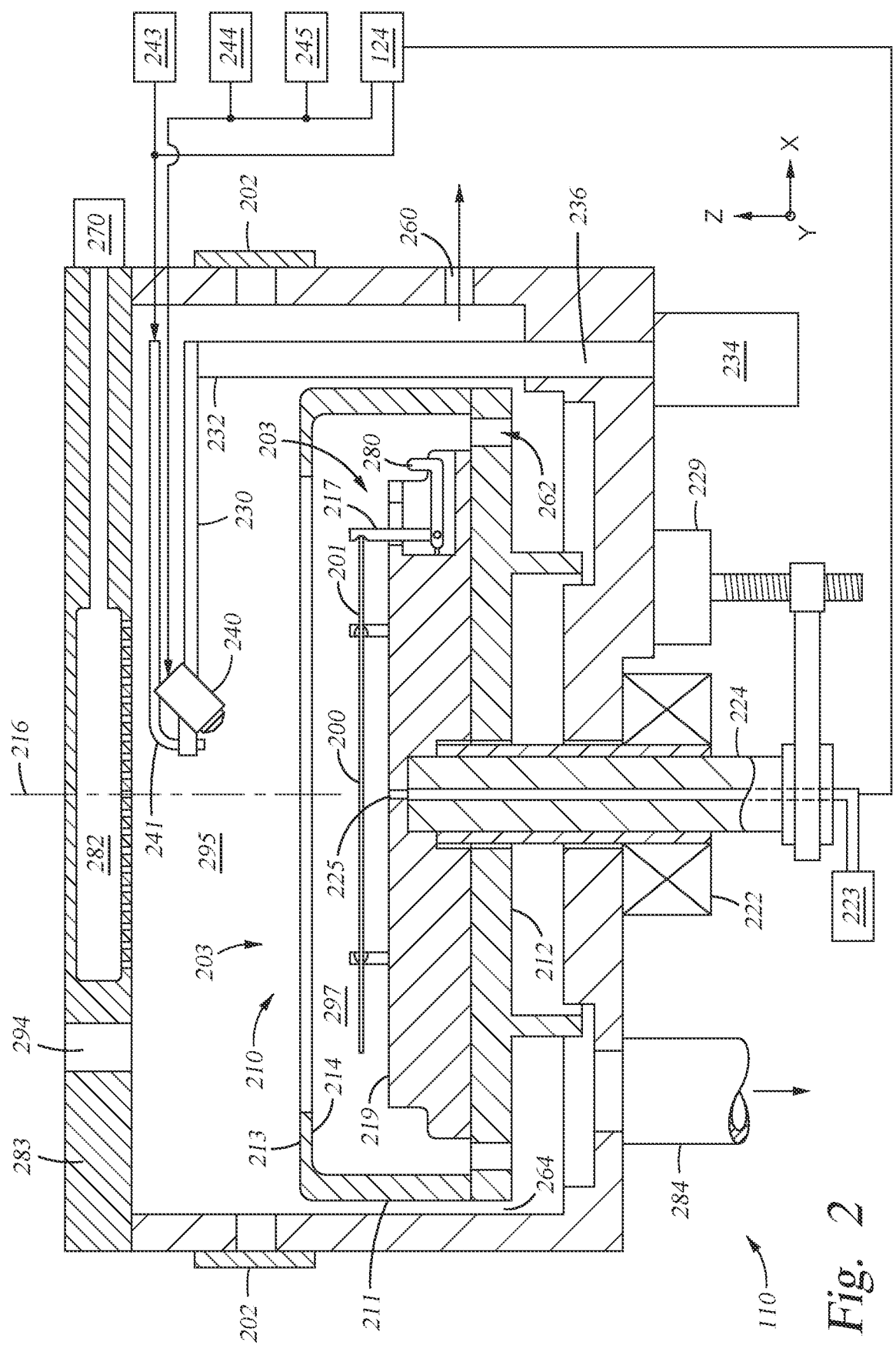
FIG. 2 is a side view of an example of an integrated cleaning and dry (ICD) station.

FIG. 2 is a schematic illustration of a cross sectional view of an ICD module 110 that is representative of the ICD modules 110A, 110B and that may be utilized in a cleaning unit 106A, 106B, as described above. The ICD module 110 may receive a substrate 200 to be cleaned after the substrate 200 has been cleaned within one or more of the pre-cleaning module 107 and the vertical cleaning modules 109A, 1096, and before the substrate 200 is received by the first substrate handler 103 in the factory interface 102. The ICD module 110 may be utilized to remove contamination from the substrate 200 that, if not removed, may lead to a corresponding substrate 200 not meeting cleanliness requirements for subsequent processing steps and being discarded. In one example, the ICD module 110 is configured to perform a cleaning and drying process that prevents the formation of water droplet marks on a surface of the substrate 200. In general, the processes performed in each ICD module 110 are the last cleaning processes performed in a cleaning sequence performed on the substrate in the CMP system 100. The processes performed in each ICD module 110 can include one or more cleaning steps in which a cleaning fluid or rinsing fluid (e.g., DI water) is supplied to the top side and/or bottom side of the substrate and then a drying process is performed on the substrate.

The ICD module 110 includes a substrate gripping device 203, sweep arm 230, first outlet port 240, second outlet port 241, plenum 282, exhaust 260, drain 284, and gas source 270. The ICD module 110 may further include a sensing device 294, such as a camera to detect the state of the cleaning process or retroreflective position sensing device to sense the position of the substrate within the interior volume 295.

The substrate gripping device 203 is configured to support, hold and/or retain the substrate 200 in a horizontal orientation. For example, the substrate gripping device 203 is configured to support the substrate 200 in a horizontal orientation that is perpendicular to a vertically oriented rotational axis 216. The substrate gripping device 203 includes a catch cup 210 and a substrate gripping device 203. The catch cup 210 may include a shroud 211 and a base plate 212. The shroud 211 may be coupled to the base plate 212. For example, the shroud 211 may be coupled to the base plate 212 via one or more bolts. One or more of the shroud 211 and the base plate 212 may include one or more threaded portions configured to receive a threaded bolt.

The base plate 212 may include drain holes 262 positioned in an array along the edge of the base plate 212 such that fluid flows into the drain 284 while the substrate 200, the substrate gripping device 203, and the catch cup 210, are rotated by the drive motor 222. Further, a labyrinth 264 may be formed between the catch cup 210 and the housing of the ICD module 110. The labyrinth 264 may be configured to at least partially limit fluid from flowing back through the labyrinths 264 and into the interior volume 295.

The catch cup 210 includes a wall 213 having an annular inner surface 214. The annular inner surface 214 defines a processing volume 297 within the substrate gripping device 203. The annular inner surface 214 has an angled portion that is symmetric about a central axis, e.g. rotational axis 216 of the substrate gripping device 203. For example, the substrate 200 may be cleaned within the processing volume 297.

The substrate gripping device 203 holds the substrate 200 while DI water and/or a third cleaning fluid is applied to the substrate 200 for cleaning. The substrate gripping device 203 may also include gripping pins 217 that are couple to a plate 219. In one or more embodiments, each gripping pin 217 may be coupled to an element 280 that is configured to contact the housing of the shroud 211 when the plate 219 is positioned relative to the catch cup 210 by use of the actuator 229. The contact between the element 280 and the surface 214 of the shroud 211 imparts a translation motion onto the gripping pins 217. For example, in response to the element 280 contacting the annular inner surface 214 of the shroud 211, when the plate 219 and substrate gripping device 203 are moved in the +Z direction by the actuator 229, the elements 280 contact the annular inner surface 214 of the shroud 211 and pivot. In response, a pivoting and/or translation motion is imparted onto the gripping pins 217 coupled to the elements 280. In one embodiment, the elements 280 continue to pivot until movement of the substrate gripping device 203 in the +Z direction is stopped. In one embodiment, the elements 280 and gripping pins 217 are positioned in an open position after movement of the plate 219 in the +Z direction has stopped.

A spring element, such as a flat or coil spring, may further return the element 280 to a starting position, moving the gripping pin 217 to a gripping position in response to the element 280 no longer contacting the annular inner surface 214 of the shroud 211. A biasing force from the spring element may load the element 280, such that the element 280 returns to the starting position, and the gripping pin 217 returns to the gripping position, when the element 280 is no longer contacting the housing of the shroud 211.

One or more fluids may be applied to the processing surface 201 of the substrate 200 by a first outlet port 240 and a second outlet port 241. For example, a first fluid source 243 may supply de-ionized water and/or an IPA vapor to the second outlet port 241 that is positioned to deliver the fluid to a surface of the substrate 200, and the first outlet port 240 may apply de-ionized (DI) water to the processing side of the substrate 200. The second outlet port 241 is also configured to provide gas, such as an inert gas, nitrogen or another desired gas, from the connected one of the gas pallet assembly 124.

The first outlet port 240 may be, for example, include a megasonic nozzle. The first outlet port 240 may include one or more elements such as a megasonic actuator configured to alternatively apply megasonic energy in the form of waves within the cleaning fluid in an alternating fashion according to a sinusoidal or other pattern to generate a megasonic actuated fluid. The cleaning fluid can be delivered from a first fluid source 243 that is adapted to deliver DI water and/or a cleaning solution (i.e., acid or base solution). For example, the first outlet port 240 may be configured to alternatively apply megasonic energy in a sinusoidal pattern at a rate of between about 430 kHz to 5 MHz, such as 950 kHz to generate the megasonic actuated DI water that is provided to the surface of the substrate 200. Alternatively, other frequencies may be used.

Fluids may be applied to the backside of the substrate 200 via an opening 225 formed in the base plate 219, which is coupled to a fluid source 223 through the shaft 224, while the substrate gripping device 203 and the catch cup 210 are rotated. The shaft 224 may include one or more tubes (not shown) that are configured to deliver DI water, cleaning fluids and/or a gas to the backside of the substrate 200. The opening 225 formed in the base plate 219 is also coupled to one of the gas pallet assemblies 124 for provided gas below the substrate 200 when desired.

A drive motor 222 may be coupled to the substrate gripping device 203 via shaft 224. The drive motor 222 rotates the substrate gripping device 203 and the catch cup 210 about rotational axis 216. Further, the drive motor may be one of a hydraulic, pneumatic, electro-mechanical, and a magnetic motor. The substrate gripping device 203, substrate 200 and the catch cup 210 are configured to be rotated together (e.g., simultaneously), so that relative velocity between the substrate 200 and the catch cup 210 are substantially the same to reduce the chances of droplets flung off of the surface of a rotating substrate, due to the delivery of a fluid to the front or backside of the substrate, from rebounding off of the inner surface of the catch cup 210 and landing on a surface of the substrate.

A door 202 may cover an opening formed in the wall (e.g., enclosure wall) 283 and provide access to the interior volume 295 of the ICD module 110 for inserting and removing the substrate 200 from the ICD module 110. When the door 202 is in a closed position, the interior volume 295 of the ICD module 110 may be referred to as an isolated environment. For example, when the door 202 is closed, the interior volume 295 of the ICD module 110 is isolated from the external environment, such that fumes (e.g., IPA vapor) and liquids generated and/or used during cleaning of the substrate 200 do not escape from the ICD module 110 during the cleaning process. Any fumes and cleaning liquids used and/or generated during the cleaning process are removed from the ICD module 110 in a controlled manner via the exhaust 260 and/or the drain 284. Air may be provided to plenum 282 by gas source 270, and exhausted from the ICD module 110 by exhaust 260. Further, the plenum 282 and exhaust 260 may be configured to control the flow of air within the ICD module 110 to prevent particles from reattaching to the surface of the substrate 200. The air flow provided to the ICD modules 110 can be provided at a desired pressure and flow rate to assure the removal of vapors (e.g., IPA vapor) and/or airborne particles and the like formed within the processing region of the ICD modules 110 during processing. In some embodiments in which nitrogen gas is delivered into the ICD modules 110, it may be desirable to eliminate the use of a HEPA filter from the system to reduce system and maintenance costs and reduce system complexity. In some embodiments, the gas source 270 is configured to provide filtered air or other gas so that a desired pressure (e.g., greater than atmospheric pressure) is maintained in the processing region of the ICD module 110A.

The drain 284 may be utilized to remove excess moisture from the ICD module 110. In one embodiment, the drain 284 removes excess cleaning fluids from the ICD module 110 during a cleaning process.

The interior volume 295 of the ICD module 110 may be defined as being between the catch cup 210 and the wall (e.g., enclosure wall) 283. Substrates (e.g., the substrate 200) may be inserted into the interior volume 295 when being loaded into the ICD module 110 and removed from the interior volume 295 when being removed from the ICD module 110.

The sensing device 294 may detect the substrate 200 within the ICD module 110. For example, the sensing device 294 may detect the substrate 200 within the interior volume 295. Further, the sensing device 294 may detect the substrate 200, while the substrate 200 is being held by the substrate gripping device 203. The sensing device 294 may detect when the substrate 200 has been properly or improperly loaded into the substrate gripping device 203. Further, the sensing device 294 may detect when the substrate 200 has been dropped or fallen out of the substrate gripping device 203. The sensing device 294 may further determine when the substrate 200 has been inserted into the ICD module 110 and removed from the ICD module 110.

The sweep arm 230 is coupled to a sweep arm shaft 232 and a sweep arm drive motor 234. The sweep arm shaft 232 and the sweep arm drive motor 234 forms the sweep arm drive assembly 236.

The sweep arm drive motor 234 may be coupled to sweep arm shaft 232 and be configured to move the outlet ports 240, 241 on the distal end of the sweep arm 230 in an arcuate path that is parallel to a surface of the substrate 200. The sweep arm 230 may include a one or more tubes to deliver fluids to the outlet ports 240, 241. The sweep arm drive assembly 236 is configured to move the outlet ports 240, 241 over the surface of the substrate 200 during the cleaning process, such that the cleaning fluids output by the outlet ports 240, 241 are evenly distributed over the surface of the substrate 200. The sweep arm drive assembly 236 may also be configured to move the sweep arm 230 vertically to set a distance between the outlet ports 240, 241 and the surface of the substrate 200

In some embodiments, the second outlet port 241 is adapted to provide an IPA vapor to a surface of the substrate 200 while DI water is provided to the surface of the substrate 200 by the first outlet port 240 to create a "Marangoni" effect to dry the surface of the substrate 200. The IPA vapor is provided from an IPA vapor delivery assembly that can include an IPA vapor generation source 244 and a carrier gas delivery source 245. The IPA vapor generation source 244 can include an IPA liquid vaporizing device (not shown) that is configured to receive liquid IPA and convert it into a vapor, which is then mixed with a carrier gas (e.g., $N_2$) provided from the carrier gas delivery source 245, and then provided to the surface of the substrate during the Marangoni drying process. During the horizontally oriented Marangoni drying process the sweep arm 230 moves the outlet ports 240, 241 in an arcuate path from a center region to an edge region of the substrate to create a moving boundary of the DI water that moves outward from the center to the edge of the substrate. In this case, the first outlet port 240, which is providing DI water to the surface of the substrate, will lead the second outlet port 241, which is providing an IPA vapor carrier gas mixture to the surface of the substrate, as the sweep arm 230 moves the outlet ports 240, 241 in an arcuate path from a center region to an edge region The first outlet port 240 is also configured to provide gas, such as an inert gas, nitrogen or another desired gas, from the connected one of the gas pallet assembly 124.

The position of the sweep arm 230 and/or the outlet ports 240, 241 may be adjusted to ensure that the outlet ports 240, 241 pass over the center of a rotating substrate 200 during processing. Further, at least one of the position of the sweep arm 230 and the position of the outlet ports 240, 241 may be adjusted such that the outlet ports 240, 241 pass over a portion of the substrate 200 other than the center of the substrate 200. For example, the outlet ports 240, 241 may be moved relative to the sweep arm 230 and/or the sweep arm 230 may be moved relative to sweep arm shaft 232 to vary the position of the outlet ports 240, 241 relative to surface of the substrate 200. Further, the axial distance between outlet ports 240, 241 and the surface of the substrate 200 may be varied to aid in the cleaning process. The sweep arm drive motor 234 moves the sweep arm shaft 232 and in-turn, the sweep arm 230 and outlet ports 240, 241 over the substrate 200 during the cleaning processes.

The various modules 107, 109, 110 included in the cleaning unit 106 are modular. Accordingly, the modules 107, 109, 110 can be changed as required by, for example, service and/or routine maintenance, or by a particular application.

Referring back to FIGS. 1A-1B, the third substrate handler 108 may transfer the substrate 200 from the vertical cleaning module 109B to an available one of the ICD modules 110A, 110B. That is, while one substrate 200 is subject to a cleaning and drying process in one of the ICD modules 110A, 110B, the third substrate handler 108 may transfer the substrate 200 to the other one of the ICD modules 110A, 110B (generically, ICD module 110) that is not currently performing cleaning and drying processing on a substrate 200. During transfer of the substrate 200 from the vertical cleaning module 109B to the available ICD module 110, the third substrate handler 108 may rotate the substrate 200 by 90 degrees about the Y-axis so that the processing surface 201 of the substrate 200 is facing upward, i.e., in the Z-direction, when positioned in the ICD module 110.

The first substrate handler 103 may transfer the substrate 200 from the ICD module 110 via a second door 110D formed in a second side panel of the ICD module 110. The first side panel of the ICD module 110 and the second side panel of the ICD module 110 may parallel to one another and on opposite sides of the ICD module. The door 110D may be, for example, a slit valve. The first substrate handler 103 may transfer the substrate 200 from the ICD module 110 to one of the loading stations 102A.

The cleaning unit 106 also includes a fluid and plumbing section 111. For example, as shown in FIG. 1B, the fluid and plumbing section 111 is disposed at the bottom of the cleaning units 106A, 106B, and below the robot tunnel 104T. The fluid and plumbing section 111 includes a catch basin 120 for collecting fluids that may leak from plumbing or be splashed out of one of the modules of the cleaning units 106. The catch basin 120 includes a sensor 122 configured to detect the presence and/or level of fluid within the catch basin 120. The sensor 122 is coupled to a system controller (not shown). The system controller, based on a metric indicative of the presence and/or level of fluid within the catch basin 120, is configured to output a warning signal, terminate one or more of the processes being performed in one or more of the cleaning units 106, or cease the flow of one or more fluids being routed within or to one or more of the cleaning units 106. The warning signal may be any one or more of a visual signal, an audible signal, an electronic communication (such as to another controller, computer system, cell phone, electronic mail, a text message and the like).

The fluid and plumbing section 111 includes liquid delivery modules (LDMs) and the gas pallet assemblies 124. Each cleaning unit 106A, 106B is associated with at least one LDM and at least one gas pallet assembly 124. In FIG. 1B, LDMs 111A, 111B, 111D and 111D (as well as conduits, valves, and the like, not shown) are provided for supplying process liquids required by each individual module 107, 109, 110 in each cleaning unit 106A, 106B. For example, LDM 111A may supply process liquids to the pre-cleaning module 107. Similarly, two different LDMs 111B may each supply process liquids to a respective one of the vertical cleaning modules 109A, 109B, and two different ICD LDMs 111C may each supply process liquids to a respective one of the ICD modules 110.

In some embodiments, each LDM 111A-111D may be a dedicated liquid delivery module for supplying a process liquid to a single, specific one of the modules 107, 109, 110. Accordingly, when one of the cleaning units 106A, 106B is configured with only a single ICD module 110 (as described above), a single ICD LDM 111C may be provided in the corresponding fluid and plumbing section 111 for supplying a process liquid to the single ICD module 110.

As discussed above, the fluid and plumbing section 111 also includes at least one gas pallet assembly 124 for providing gas to each cleaning unit 106A, 106B. For example, each cleaning unit 106A, 106B includes at least one separate and dedicated gas pallet assembly 124. In FIG. 1B, the fluid and plumbing section 111 includes 4 gas pallet assemblies 124, each labeled as 124A, 124B, 124C, 124D. For example, the gas pallet assembly 124A supplies process gas to the ICD module 110A, while the gas pallet assembly 124B supplies process gas to the other ICD module 110B. Since each ICD module 110 of the cleaning units 106A, 106B have a dedicated gas pallet assembly 124A, 124B, one gas pallet assembly 124 may be serviced or replaced while the other ICD modules within the cleaning units 106A, 106B remain operational. Moreover since each gas pallet assembly 124 is modular, additional or different gas pallet assemblies 124 may be added if recipes or processes are changed within a specific gas pallet assembly 124 or if additional gas pallet assemblies 124 are added simply by replacing one gas pallet assembly 124 for another and/or adding one or more additional gas pallet assemblies 124.

Figure 3:
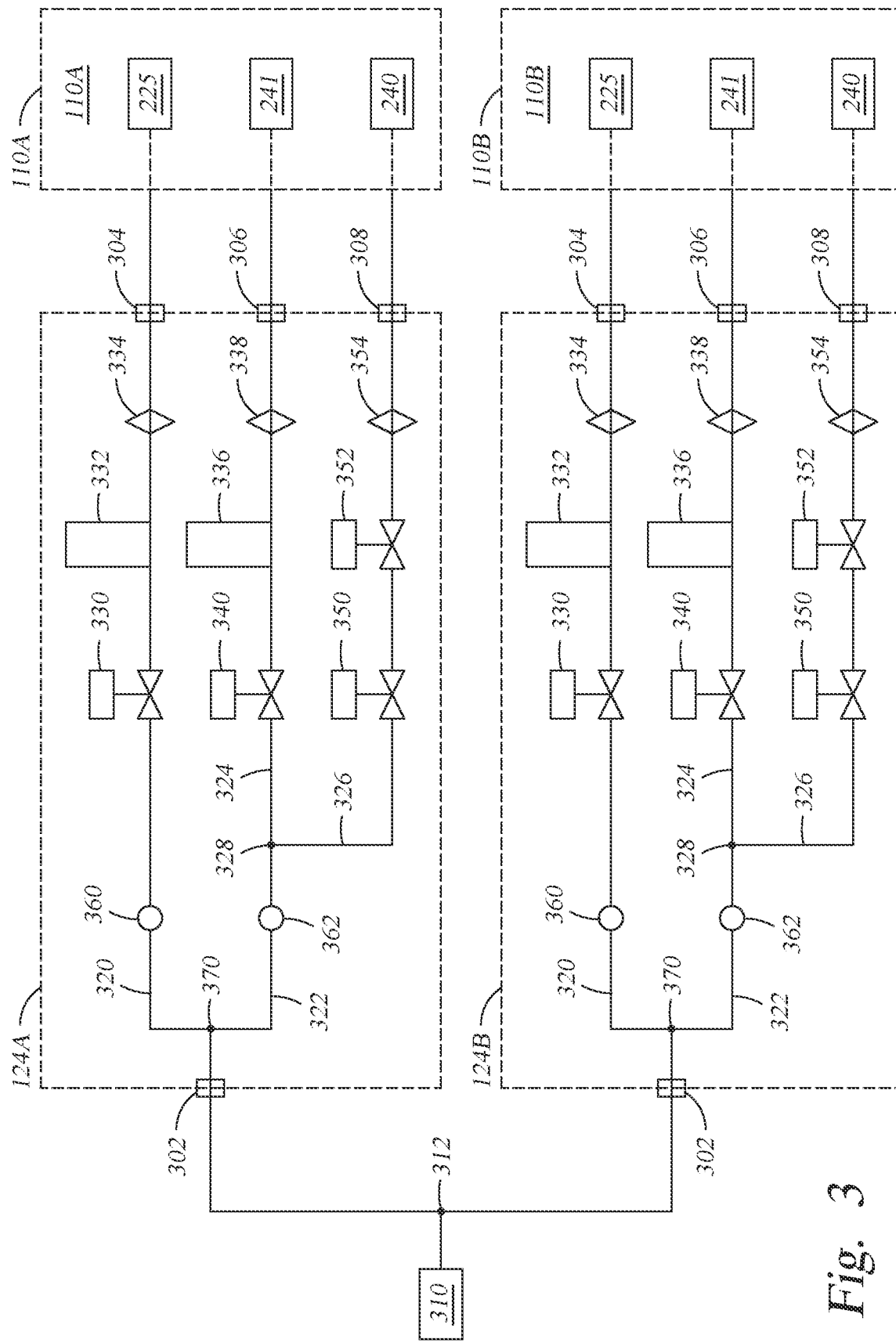
FIG. 3 is a schematic diagram of two gas pallet assemblies configured to provide gas to separate the ICD stations of FIG. 2.

FIG. 3 is a schematic diagram of two gas pallet assemblies 124A, 124B configured to provide gas to separate the ICD stations 110A, 110B of FIG. 2. The gas pallet assembly 124A and the gas pallet assembly 124B are identical excepted that the outlet ports of gas pallet assembly 124A are coupled to ICD module 110A, while the outlet ports of gas pallet assembly 124B are coupled to ICD module 110B.

The gas pallet assembly 124A generally includes an input port 302 and at least 3 outlet ports, such as a first outlet port 304, a second outlet port 306, and a third outlet port 308. The input port 302 of the gas pallet assembly 124A may be directly connected to a gas source 310, or may be coupled in parallel to the gas source 310 with the input port 302 of the gas pallet assembly 124B, and/or with other input ports of one or more of the other gas pallet assemblies 124. The gas source 310 is configured to provide an inert gas, nitrogen, IPA vapor, clean dry air, or another desired gas.

The first outlet port 304 is configured to be connected to the opening 225 formed in the base plate 219 of the ICD module 110A so that the gas pallet assembly 124A may provide gas below the substrate 200 when desired. The second outlet port 306 is configured to be connected to the second outlet port 241 is also configured to provide gas to the top surface 201 of the substrate 200 as part of the substrate final clean, such as an inert gas, nitrogen, IPA vapor, clean dry air, or another desired gas. The third outlet port 308 is configured to be connected to the first outlet port 240 so that the gas pallet assembly 124A may provide gas to dry the gripping pins 217 so that subsequently processed the substrates will not be cross contaminated from slurry or other particle remaining on the gripping pins 217 after the last substrate cleaning process. The first and second outlet ports 240, 241, being attached to the arm 230, may be rotated to different positions over the substrate 200 (and base plate 219), and also rotated clear of the substrate 200 (and base plate 219).

The gas pallet assembly 124A includes two primary gas conduits 320, 322. Each primary gas conduit 320, 322 is coupled through a tee 370 to the inlet port 302. Alternatively, primary gas conduit 320, 322 may include a separate inlet ports 302 for connecting directly to the gas source 310 (as later depicted in FIG. 4).

The first primary gas conduit 320 includes a pressure regulator 360, a shut-off valve 330, a flow controller 332 and a filter 334. The pressure regulator 360 is disposed between the shut-off valve 330 and the inlet port 302, downstream of the tee 370 when the tee 370 is present. The pressure regulator 360 may be set manually or electronically to control the pressure of gas entering the first primary gas conduit 320. The shut-off valve 330 is connected to the output of the pressure regulator 360, and may be any suitable shut-off valve. In one example, the shut-off valve 330 is a normally closed solenoid valve.

The flow controller 332 is disposed between the shut-off valve 330 and the filter 334. The flow controller 332 may be a mass gas flow meter, a needle valve, a proportional valve, or other suitable gas flow controller. In the example depicted in FIG. 3, the flow controller 332 is mass gas flow meter.

The filter 334 is generally a micron sized filter or other suitable filter. The inlet of the filter 334 is connected to the flow controller 332, while the output of the filter 334 is connected to the outlet port 304.

The second primary gas conduit 322 includes a splitter 328, such as a tee, that splits the second gas conduit 322 into a first branch 324 and a second branch 326. The first branch 324 is connected to the second outlet port 306. The second branch 326 is connected to the third outlet port 308. The second gas conduit 322 may be split as gas is not provided through the first outlet port 240 to dry the gripping pins 217 and through the second outlet port 241 to the top surface 201 of the substrate 200 during a final substrate clean at the same time.

A pressure regulator 362 is disposed between the splitter 328 and the input port 302. The pressure regulator 362 may be set manually or electronically to control the pressure of gas entering the first and second branches 324, 326 of the second primary gas conduit 322.

The first branch 324 includes a shut-off valve 340, a flow controller 336 and a filter 338. The shut-off valve 340 may be any suitable shut-off valve, and in one example, is a normally closed solenoid valve.

The flow controller 336 is disposed between the shut-off valve 340 and the filter 338. The flow controller 336 may be a mass gas flow meter, a needle valve, a proportional valve, or other suitable gas flow controller. In the example depicted in FIG. 3, the flow controller 336 is mass gas flow meter.

The filter 338 is generally a micron sized filter or other suitable filter. The inlet of the filter 338 is connected to the flow controller 336, while the output of the filter 338 is connected to the second outlet port 306.

Similarly, the second branch 326 includes a shut-off valve 350, a flow controller 352 and a filter 354. The shut-off valve 350 may be any suitable shut-off valve, and in one example, is a normally closed solenoid valve.

The flow controller 352 is disposed between the shut-off valve 340 and the filter 338. The flow controller 352 may be a mass flow controller, a needle valve, a modulating valve or an orifice plate, or other suitable gas flow control device. In the example depicted in FIG. 3, the flow controller 352 is needle valve as the flow of gas used to clean the gripper pins 217 does not need precise control.

The filter 338 is generally a micron sized filter or other suitable filter. The inlet of the filter 338 is connected to the flow controller 352, while the output of the filter 338 is connected to the second outlet port 306.

Figure 4:
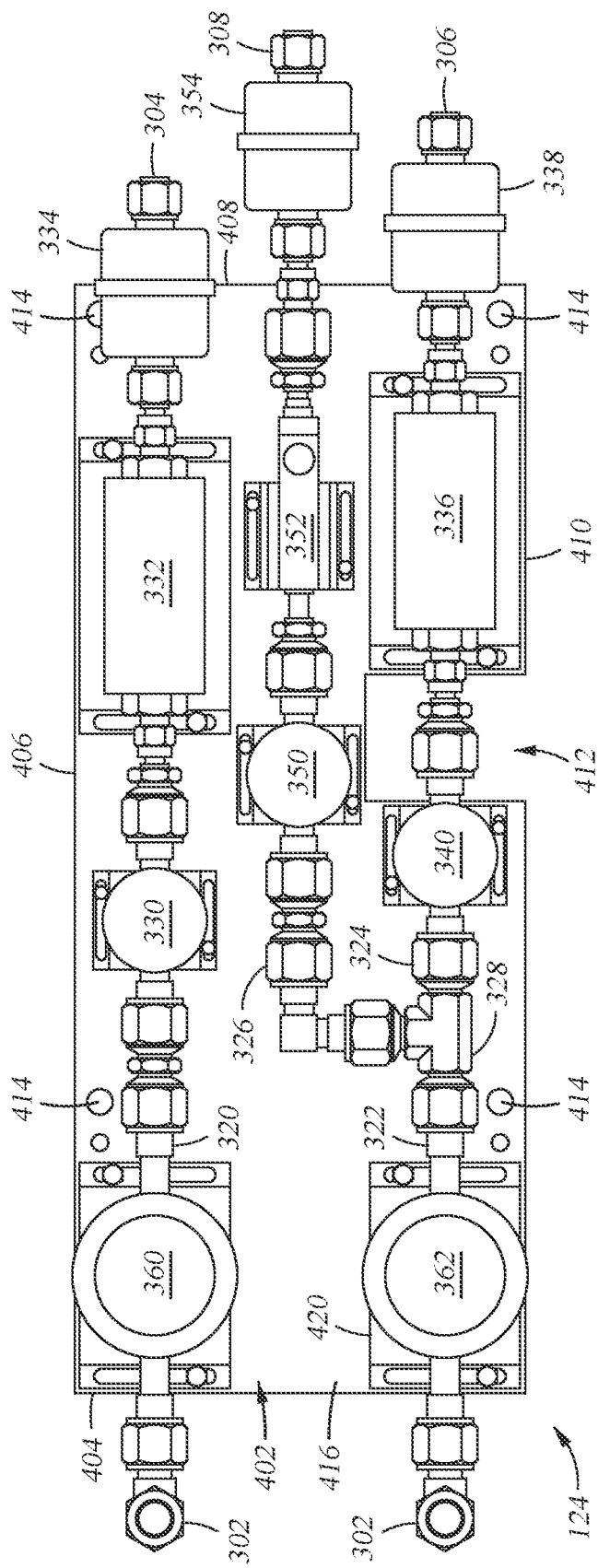
FIG. 4 is a top view of a gas pallet assembly.

FIG. 4 is a top view of a gas pallet assembly 124. The gas pallet assembly 124 includes a mounting plate 402 to which the pressure regulators 360, 362, shut-off valves 330, 340, 350, and flow controllers 332, 336, 352 are mounted. The filters 334, 338, 354 may optionally be mounted to the mounting plate 402 or may simply be an inline filter. Each of the pressure regulators 360, 362, shut-off valves 330, 340, 350, and flow controllers 332, 336, 352 may be mounted to the mounting plate 402 using a bracket 420 that spaces the pressure regulators 360, 362, shut-off valves 330, 340, 350, and flow controllers 332, 336, 352 above a top surface 416 of the mounting plate 402. Spacing the above components above the top surface 416 of the mounting plate 402 provides extra space for tools needed to tighten/loosen tube fittings connecting the components together. Spacing the components above the top surface 416 of the mounting plate 402 also allows potential leakage to be more readily detected.

The mounting plate 402 is fabricated from a polymer that is resistive to the fluids present in the cleaning unit. In one example, the mounting plate 402 is fabricated from CPVC or PVC. Alternatively, the mounting plate 402 is fabricated from a metal coated to resist the damage by the fluids present in the cleaning unit.

The mounting plate 402 is generally rectangular and includes two short sides 404, 408 and two long sides 406, 410. Generally, the input port 302 is disposed at the first side 404 of the mounting plate 402 and the outlet ports 304, 306, 308 are disposed at the second short side 408 of the mounting plate 402. In the example of the gas pallet assembly 124 depicted in FIG. 4, the first primary gas conduit 320 and the second primary gas conduits 322 each have separate input ports 302 disposed at the first side 404 of the mounting plate 402.

[ono] The long side 410 includes a cutout 412. The cutout 412 is generally positioned over the sensor 122 configured to detect fluid in the catch basin 120. The size and position of the cutout 412 enables the sensor 122 to be maintenance without removal of the gas pallet assembly 124 from the fluid and plumbing section 111.

The pressure regulators 360, 362 are generally positioned side-by-side on the top surface 416 of the mounting plate 402. However, one or more of the shut-off valves 330, 340, 350, and/or one or more of the flow controllers 332, 336, 352 may be staggered on the top surface 416 of the mounting plate 402 in a direction parallel to the long side 406 so that the short sides 404, 408 may be smaller, and to also provide additional tool space for tightening the various fittings connecting the regulators, valves, controllers and filters of the gas pallet assembly 124.

Figure 5:
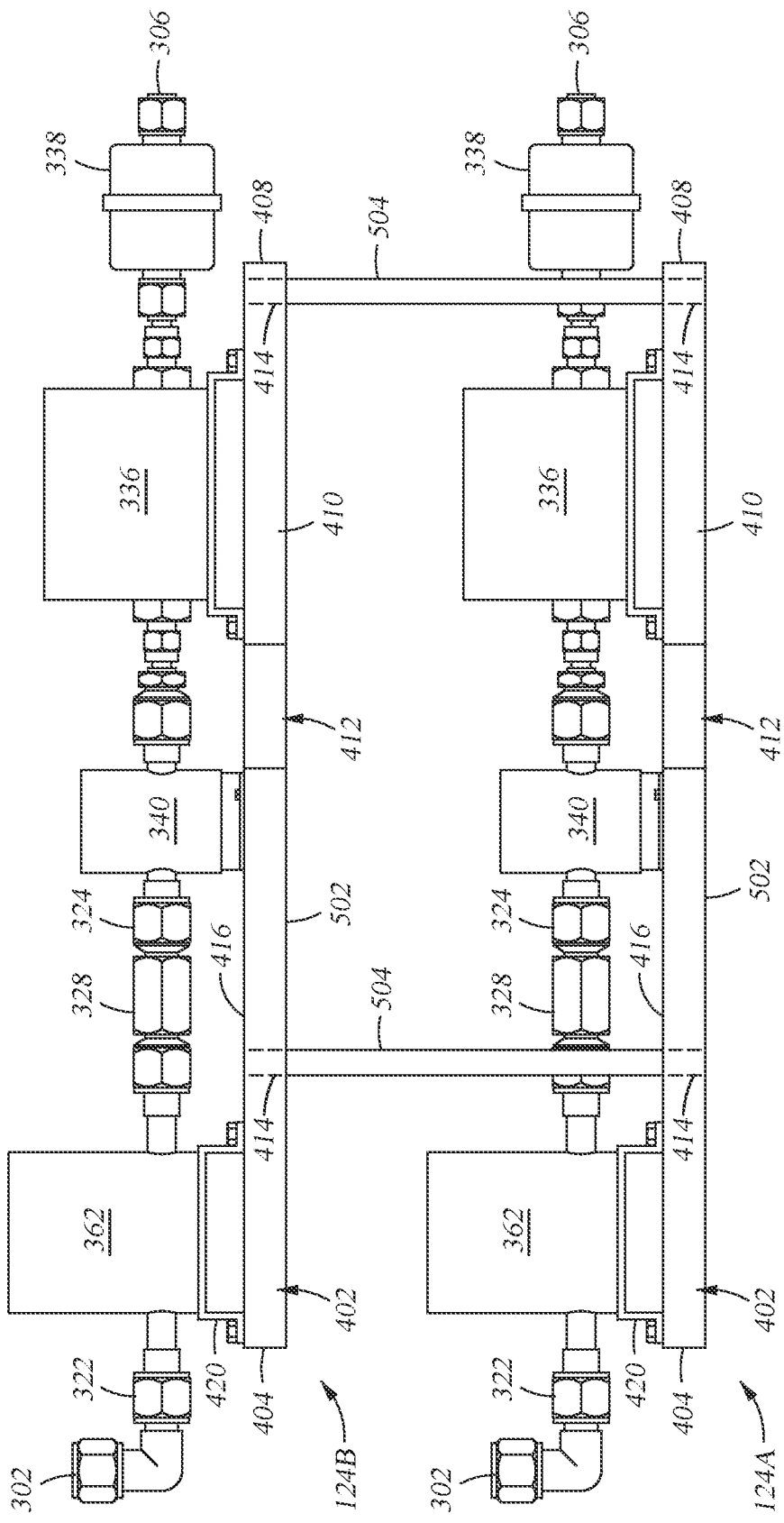
FIG. 5 is a partial schematic side view of stacked gas assemblies.

The top surface 416 of the mounting plate 402 includes a plurality of standoff receiving holes 414. In one example, two standoff receiving holes 414 are located along the long side 406 while two additional standoff receiving holes 414 are located along the opposite long side 410. The standoff receiving holes 414 may be located in other locations. Better shown in FIG. 5, a bottom surface 502 of the mounting plate 402 also includes a plurality of standoff receiving holes 414 that align or are a singular hole with the standoff receiving holes 414 present on the top surface 416. Thus, a standoff 504 may be used on connect the top surface 416 of the of the mounting plate 402 of the gas pallet assembly 124A to the a bottom surface 502 of the mounting plate 402 of the gas pallet assembly 124B. One or more additional gas pallet assemblies 124 may be stacked on gas pallet assembly 124B using additional standoffs 504 as space permits.

Thus, modular gas pallet assemblies are disclosed herein that can be stacked in the bottom region of the cleaning unit. The gas pallet assemblies may readily be exchanged and/or added to the cleaning unit, thus, enabling efficient and cost effective service and expansion of the cleaning unit. The location of the stacked gas pallet assemblies also enables ease of service, including enabling one cleaning module to be serviced while the other cleaning modules of the cleaning unit remain operational, thus having minimal impact on factory throughput during servicing.

While the foregoing is directed to embodiments of the present disclosure, other and further embodiments of the disclosure may be devised without departing from the basic scope thereof, and the scope thereof is determined by the claims that follow.

What is claimed is:

1. A gas pallet assembly comprising:
a first mounting plate;
a first primary gas conduit secured to the first mounting plate, the first primary gas conduit comprising:
 a first inlet port;
 a first normally closed valve;
 a first regulator coupled between the first normally closed valve and the first inlet port;
 a first outlet port;
 a first filter coupled to the first outlet port; and
 a first flow controller coupled between the first filter and the first normally closed valve; and
a second primary gas conduit secured to the first mounting plate, the second primary gas conduit comprising:
 a second inlet port;
 a second normally closed valve;
 a second regulator coupled between the second normally closed valve and the second inlet port;
 a second outlet port;
 a second filter coupled to the second outlet port;
 a second flow controller coupled between the second filter and the second normally closed valve;
 a third normally closed valve coupled to a tee disposed between the second regulator and the second normally closed valve;
 a third outlet port;
 a third filter coupled to the third outlet port; and
 a third flow controller coupled between the second filter and the second normally closed valve.

2. The gas pallet assembly of claim 1, wherein the first and second flow controllers are mass flow controllers.

3. The gas pallet assembly of claim 2, wherein the third flow controller is selected from the group consisting of a mass flow controller, a needle valve, a modulating valve or an orifice plate.

4. The gas pallet assembly of claim 2, wherein the first mounting plate is fabricated from a plastic material.

5. The gas pallet assembly of claim 1, wherein the first mounting plate is rectangular.

6. The gas pallet assembly of claim 5, wherein the first mounting plate has a cutout disposed along a long edge of the rectangular first mounting plate.

7. The gas pallet assembly of claim 2, wherein a fitting connecting the second normally closed valve to the second flow controller is exposed through the cutout of the first mounting plate.

8. The gas pallet assembly of claim 2, wherein the first mounting plate is fabricated from a polymer.

9. The gas pallet assembly of claim 1 further comprising:
a second mounting plate coupled to the first mounting plate;
a third primary gas conduit secured to the second mounting plate, the third primary gas conduit comprising:
 a fourth inlet port;
 a fourth normally closed valve;
 a fourth regulator coupled between the fourth normally closed valve and the fourth inlet port;
 a fourth outlet port;
 a fourth filter coupled to the fourth outlet port; and
 a fourth flow controller coupled between the fourth filter and the fourth normally closed valve; and
a fourth primary gas conduit secured to the second mounting plate, the fourth primary gas conduit comprising:
 a fifth inlet port;
 a fifth normally closed valve;
 a fifth regulator coupled between the fifth normally closed valve and the fifth inlet port;
 a fifth outlet port;
 a fifth filter coupled to the fifth outlet port;
 a fifth flow controller coupled between the fifth filter and the fifth normally closed valve;
 a sixth normally closed valve coupled to a tee disposed between the fifth regulator and the fifth normally closed valve;
 a sixth outlet port;
 a sixth filter coupled to the sixth outlet port; and
 a sixth flow controller coupled between the sixth filter and the sixth normally closed valve.

10. The gas pallet assembly of claim 9, wherein the second mounting plate is stacked directly above the first mounting plate by a plurality of standoffs.

11. The gas pallet assembly of claim 9, wherein the first mounting plate is rectangular and has a first cutout disposed along a long edge of the rectangular first mounting plate; and
wherein the second mounting plate is rectangular and has a second cutout disposed along a long edge of the rectangular second mounting plate, wherein first and second mounting plates have a same size, and wherein first and second cutouts are aligned one over the other and have a same size.

12. A substrate cleaning unit comprising:
the gas pallet assembly of claim 1 having the first and second inlet ports connected to a common supply fitting and configured to receive gas from a common gas source; and
a first cleaning module (FCM) comprising:
  a base plate having gripper pins configured to secure a substrate during processing;
  a first arm movable between positions above and clear of the base plate;
  a first FCM outlet port disposed on the first arm, the first FCM outlet port connected to the first outlet port;
  a second FCM outlet port disposed on the first arm, the second FCM outlet port connected to the second outlet port; and
  a third FCM outlet port disposed in the base plate, the third FCM outlet port connected to the third outlet port.

13. The substrate cleaning unit of claim 12, wherein the gas pallet assembly is disposed directly below the first cleaning module.

14. The substrate cleaning unit of claim 12 further comprising:
a second cleaning module stacked on the first cleaning module; and
a second gas pallet assembly coupled to the second cleaning module.

15. The substrate cleaning unit of claim 14 wherein the second gas pallet assembly further comprises:
a second mounting plate coupled to the first mounting plate;
a third primary gas conduit secured to the second mounting plate, the third primary gas conduit comprising:
  a fourth inlet port;
  a fourth normally closed valve coupled to the fourth inlet port;
  a fourth regulator coupled between the fourth normally closed valve and the fourth inlet port;
  a fourth outlet port coupled to a first cleaning module gas outlet port of the second cleaning module;
  a fourth filter coupled to the fourth outlet port; and
  a fourth flow controller coupled between the fourth filter and the fourth normally closed valve; and
a fourth primary gas conduit secured to the second mounting plate, the fourth primary gas conduit comprising:
  a fifth inlet port, the fourth and fifth inlet ports connected to a common supply fitting and configured to receive gas from the common gas source;
  a fifth normally closed valve;
  a fifth regulator coupled between the fifth normally closed valve and the fifth inlet port;
  a fifth outlet port coupled to a second gas outlet port of the second cleaning module;
  a fifth filter coupled to the fifth outlet port;
  a fifth flow controller coupled between the fifth filter and the fifth normally closed valve;
  a sixth normally closed valve coupled to a tee disposed between the fifth regulator and the fifth normally closed valve;
  a sixth outlet port coupled to a third gas outlet port of the second cleaning module;
  a sixth filter coupled to the sixth outlet port; and
  a sixth flow controller coupled between the sixth filter and the sixth normally closed valve.

16. The substrate cleaning unit of claim 15, wherein the second mounting plate is stacked directly above the first mounting plate and directly below the first and second cleaning modules.

17. The substrate cleaning unit of claim 16, wherein the first mounting plate is rectangular and has a first cutout disposed along a long edge of the rectangular first mounting plate; and
wherein the second mounting plate is rectangular and has a second cutout disposed along a long edge of the rectangular second mounting plate, wherein first and second mounting plates have a same size, and wherein first and second cutouts are aligned one over the other and have a same size.

18. The substrate cleaning unit of claim 17 further comprising:
a catch basin disposed below the first gas pallet; and
a fluid sensor disposed in the catch basin directly below and aligned with the first and second cutouts.

19. A substrate processing system comprising:
a chemical mechanical polisher;
a substrate transfer device; and
a substrate cleaning unit coupled to the chemical mechanical polisher, the substrate transfer device configured to move a substrate from the chemical mechanical polisher to the substrate cleaning unit, the substrate cleaning unit further comprising:
  a first plurality of stacked integrated cleaner dryers;
  a first plurality of stacked gas pallets disposed directly below the first plurality of stacked integrated cleaner dryers, a respective one of the first plurality of stacked gas pallets coupled to a respective one of the first plurality of stacked integrated cleaner dryers;
  a second plurality of stacked integrated cleaner dryers disposed laterally offset from the first plurality of stacked integrated cleaner dryers; and
  a second plurality of stacked gas pallets disposed directly below the second plurality of stacked integrated cleaner dryers, a respective one of the second plurality of stacked gas pallets coupled to a respective one of the second plurality of stacked integrated cleaner dryers, wherein each of the gas pallets of the first plurality of stacked gas pallets further comprises:
  a mounting plate;
  a first primary gas conduit secured to the first mounting plate, the first primary gas conduit comprising:
    a first inlet port;
    a first normally closed valve;
    a first regulator coupled between the first normally closed valve and the first inlet port;
    a first outlet port coupled to a first gas outlet port positioned on a swing arm of a first one of the first plurality of stacked integrated cleaner dryers;
    a first filter coupled to the first outlet port; and
    a first flow controller coupled between the first filter and the first normally closed valve; and
  a second primary gas conduit secured to the first mounting plate, the second primary gas conduit comprising:
    a second inlet port coupled to the first inlet port, the first and second inlet ports configured to receive gas from a common source;
    a second normally closed valve;

a second regulator coupled between the second normally closed valve and the second inlet port;

a second outlet port coupled to a second gas outlet port positioned on the swing arm of the first one of the first plurality of stacked integrated cleaner dryers;

a second filter coupled to the second outlet port;

a second flow controller coupled between the second filter and the second normally closed valve;

a third normally closed valve coupled to a tee disposed between the second regulator and the second normally closed valve;

a third inlet port coupled to a third gas outlet a third gas outlet disposed in a base plate of the first one of the first plurality of stacked integrated cleaner dryers;

a third filter coupled to the third outlet port; and a third flow controller coupled between the second filter and the second normally closed valve.

* * * * *